United States Patent [19]

Dawson et al.

[11] Patent Number: 4,668,973
[45] Date of Patent: May 26, 1987

[54] SEMICONDUCTOR DEVICE PASSIVATED WITH PHOSPHOSILICATE GLASS OVER SILICON NITRIDE

[75] Inventors: Robert H. Dawson, Princeton, N.J.; George L. Schnable, Lansdale, Pa.

[73] Assignee: RCA Corporation, New York, N.Y.

[21] Appl. No.: 221,367

[22] Filed: Dec. 30, 1980

Related U.S. Application Data

[62] Division of Ser. No. 917,106, Jun. 19, 1978, Pat. No. 4,273,805.

[51] Int. Cl.⁴ .................. H01L 29/78; H01L 21/94
[52] U.S. Cl. .................................. 357/54; 357/42; 357/23.9
[58] Field of Search .................. 357/54, 73, 52, 23, 357/41, 59

[56] References Cited

U.S. PATENT DOCUMENTS

| | | | |
|---|---|---|---|
| 3,615,941 | 10/1971 | Yamada et al. | 148/187 |
| 3,756,876 | 9/1973 | Brown et al. | 156/17 |
| 3,785,043 | 1/1974 | Tokuyama et al. | 357/54 |
| 3,825,442 | 7/1974 | Moore | 427/88 |
| 3,833,919 | 9/1974 | Naber | 357/73 |
| 3,861,969 | 1/1975 | Ono et al. | 357/17 |
| 3,887,733 | 6/1975 | Tolliver et al. | 357/73 |
| 3,913,126 | 10/1975 | Hooker et al. | 357/54 |
| 3,925,572 | 12/1975 | Naber | 427/87 |
| 3,961,414 | 6/1976 | Humphreys | 29/577 |
| 3,972,756 | 8/1976 | Nagase et al. | 156/17 |
| 4,063,274 | 12/1977 | Dingwall | 357/53 |
| 4,089,992 | 5/1978 | Doo et al. | 427/94 |
| 4,091,407 | 5/1978 | Williams et al. | 357/54 |
| 4,097,889 | 6/1978 | Kern et al. | 357/54 |
| 4,142,004 | 2/1979 | Hauser, Jr. et al. | 427/39 |
| 4,224,089 | 9/1980 | Nishimoto et al. | 148/187 |
| 4,271,582 | 6/1981 | Shirai et al. | 357/23 |
| 4,273,805 | 6/1981 | Dawson et al. | 427/88 |
| 4,299,862 | 11/1981 | Donley | 427/89 |

FOREIGN PATENT DOCUMENTS

| | | |
|---|---|---|
| 51-138166 | 11/1976 | Japan . |
| 52-104087 | 9/1977 | Japan . |
| 52-149975 | 12/1977 | Japan . |
| 1151499 | 5/1969 | United Kingdom . |
| 1422033 | 1/1976 | United Kingdom . |

OTHER PUBLICATIONS

A New Self-Aligned Contact Technology, Y. Tanigaki et al, J. Electrochem. Soc.: Solid-State Science and Technology, vol. 125, No. 3, Mar. 1978, pp. 471-472.

Interaction Between Phosphosilicate Glass Films and Water, N. Nagasima et al, J. Electrochem. Soc.: Solid-State Science and Technology, No. 3, Mar. 1974, pp. 434-438.

Chemical Vapor Deposition Systems for Glass Passivation of Integrated Circuits, W. Kern, Solid-State Technology, Dec. 1975, pp. 25-33.

Philips Research Reports, "Local Oxidation of Silicon: New Technological Aspects", J. A. Appels et al., vol. 26, No. 3, Jun. 1971, pp. 157-165.

Primary Examiner—William D. Larkins
Attorney, Agent, or Firm—B. E. Morris; D. S. Cohen

[57] ABSTRACT

The semiconductor device includes a layer of silicon nitride ($Si_3N_4$) beneath a phosphosilicate glass (PSG) layer. A silicon nitride impervious layer prevents the oxidation of underlying, exposed silicon regions during a "flow" step and any "reflow" step. Accordingly, the flow of the PSG layer can be conducted in an atmosphere containing steam, which means that the PSG layer can contain less than about 7% phosphorus by weight. The reduction of the phosphorus content of the PSG layer provides increased reliability for the semiconductor device. The method of manufacturing such a device is also disclosed.

2 Claims, 12 Drawing Figures

SEMICONDUCTOR DEVICE PASSIVATED WITH PHOSPHOSILICATE GLASS OVER SILICON NITRIDE

This is a division of application Ser. No. 917,106, filed 6-19-78, now U.S. Pat. No. 4,273,805.

The present invention relates to a composite semiconductor device including a $Si_3N_4$ layer underlying a PSG layer and to the method of manufacturing such a device.

The use of a PSG layer, which is flowed over the surface of a semiconductor substrate during the manufacture of semiconductor devices, both before and after contact openings to the underlying doped semiconductor regions have been formed, has been known for several years in the semiconductor industry. Such doped, contoured, glass layers are commonly known as "reflow layers" or "reflow glasses" because of the processes used in forming such layers and after such layers have been formed. In general, the reflow glasses heretofore used have been doped with from 7–10% phosphorus, by weight. Such glasses are generally deposited onto the surface of the substrate by chemical vapor deposition and flowed over the surface of the substrate in a furnace heated to between about 1050° C. and 1075° C. into which phosphorus oxychloride ($POCl_3$) vapor is injected. During the flow step, the glass flows and sags into voids on the substrate to smooth the surface contour and round abrupt surface topologies.

As a result of the exposure to the $POCl_3$, the outer layer of glass is generally very rich in phosphorus content. Heretofore, the phosphorus rich outer layer has generally been removed by an etching step or by placing the substrate in boiling water.

Following the flow step, a photoresist layer is generally applied over the surface of the glass. The photoresist layer is then defined, and the glass is etched to form the contact openings resulting in steep walls having sharp edges at their top surface. In order to eliminate the sharp edges, a second flow step or "reflow step" is performed to smooth the sharp edges and round the steep walls in order that any metal which is deposited on the surface of the substrate will overlie smooth contours rather than sharp edges. The reflow step is usually performed in a non-oxidizing atmosphere, such as nitrogen, at temperatures between about 1050° C. and 1100° C. for a time between about 1 and 10 minutes. Higher temperatures and/or longer times are required to adequately flow PSG layers having a lower phosphorus content.

It is suspected that certain types of aluminum corrosion, which result in long term reliability problems in integrated circuit devices having aluminum metallization, are caused by phosphoric acid formed by dissolved phorphorus oxide in condensed water vapor. Accordingly, it is desirable to reduce the phosphorus doping concentration in the PSG films to below 7%. Heretofore, however, any reduction in the phosphorus doping concentration to below 7% did not provide adequate topological contouring because the PSG layer or "film" would not adequately flow.

It has been known, though, that PSG films become more fluid in the presence of water vapor. However, it has not heretofore been possible to use steam to aid in reflowing the PSG because the contact surfaces are exposed during the reflow step, and steam would cause extensive reoxidation of the silicon substrate exposed through the contact openings. In addition, any water vapor which permeated the doped glass or which reaches the silicon dioxide-silicon interface in the region of a MOS channel or field region could generate interface states which would be difficult to anneal out of the device. Accordingly, a method of making use of PSG films in which the percent of phosphorus, by weight, is less than 7%, has been desired.

The present invention relates to a method of providing PSG films having less than 7% phosphorus, by weight. Alternatively, the method can be employed in flowing PSG layers having more than 7% phosphorus, but with the flow being accomplished at lower temperatures. In accordance with the present invention, a silicon nitride layer is deposited over the surface of the semiconductor substrate prior to the deposition of the PSG film. The silicon nitride layer presents an impervious barrier to steam and prevents the oxidation of underlying semiconductor areas. Accordingly, a PSG film having a phosphorus content of less than 7%, by weight, can be applied over the surface of the silicon nitride layer and can be flowed with the aid of steam without allowing water vapor to penetrate to the silicon-silicon dioxide interface. Thus, the formation of adverse surface states and oxidation of the exposed silicon is prevented.

In addition to the advantages enumerated above, experimental results have shown that an additional synergistic advantage of providing a silicon nitride film beneath the PSG film relates to the fact that PSG films tend to have defects which lead to shorts between the aluminum metallization over them and the underlying substrate. The silicon nitride film underlying the PSG film prevents such shorts from occurring.

Another synergistic advantage which has been observed is that steam leaches the outer surface of the PSG film reducing the phosphous content thereby further reducing the possibility of a corrosion problem. In the Drawing.

Figure 1:
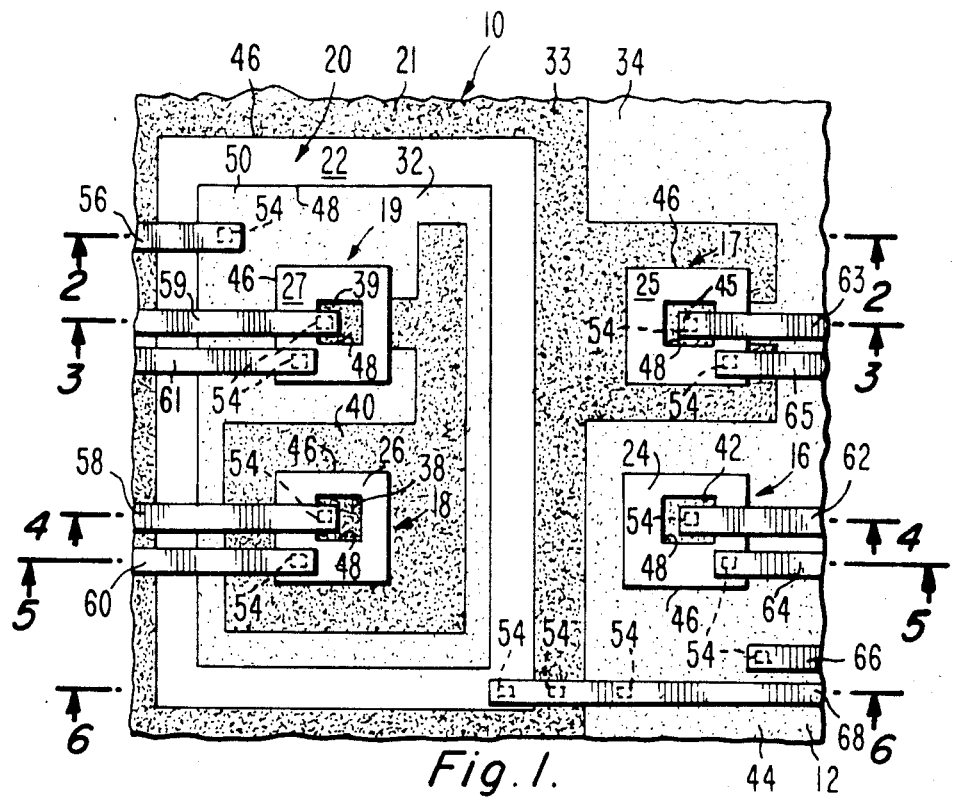
FIG. 1 is a plan view of a portion of an integrated circuit device illustrating the construction of two N-channel and two P-channel insulated gate field effect transistors therein.

In accordance with the present invention, semiconductor integrated circuits, particularly metal-oxide-semiconductor (MOS), complementary MOS (CMOS) and CMOS integrated circuits manufactured in the so-called silicon-on-sapphire (SOS) technology can be built. In addition, closed CMOS logic ($C^2L$) of the type described in U.S. Pat. No. 4,063,274 issued on Dec. 13, 1977 to A.G.F. Dingwall and assigned to RCA Corporation, which patent is hereby incorporated by reference, can also be advantageously built. The advantages inherent in the present invention can therefore be employed successfully in the manufacture of MOS integrated circuits having either aluminum or other metal gates or having doped polycrystalline silicon gates of the type used in C²L integrated circuits. In view of the fact that the present invention is intended to increase the manufacturing yield and reliability of C²L integrated circuits and has been found to be highly beneficial in the manufacture of such integrated circuits, which employ doped polycrystalline silicon gates, the preferred embodiment of the present invention will be described with particular reference to the manufacture of a C²L integrated circuit 10 shown in FIG. 1. However, those skilled in the art will recognize that the present invention can be successfully employed with minor changes, which will be pointed out hereafter, in the manufacturing of integrated circuits other than C²L, such as standard CMOS or bipolar linear integrated circuits.

The integrated circuit 10 comprises a body 12 of semiconductor material, such as silicon, which is initially of one conductivity type (N type in this example) and which has a surface 14 as shown in FIGS. 2-6. In this example, the body 12 is bulk silicon, but other forms of semiconductor material may also be used. For example, the body 12 may be an epitaxial silicon layer on an insulating substrate as would be used in a silicon-on-sapphire (SOS) construction.

Means including the body 12, that is source 44,40 drains 42, 45, 38, 39 and channel regions 47, 49 41, 43 in the body 12 and gate electrode means 24, 25, 26, 27 on the surface 14 define two P-channel insulated gate field effect transistors (IGFETs) 16, 17 and two N-channel IGFETs 18, 19 together with means 20, 21 for isolating the P-channel IGFETs 16 17 from the N-channel IGFETs 18, 19. These various means comprise a first frame-like structure 22, hereinafter called a field shield, and other frame-like structures 24, 25, 26, 27 each hereinafter called an active gate. Each of these frame-like structures includes a layer 28 (as shown in FIGS. 2-6) of insulating material and a layer 30 of conductive material on the layer 28 of insulating material. Although the layers 28 and 30 in any one gate structure are separate from the corresponding layers in each of the other frame-like structures, the particular reference numeral is applied to each of the respective insulating and conductive layers 28, 30 for convenience. The field shield 22 and each of the gate structures 24, 25, 26, 27 has a closed geometry. However, only IGFETs 16 and 18 have channel regions which surround their drains 42, 38, respectively. The field shield 22 surrounds a first portion 32 of the surface 14 and is surrounded by a guardband 33 and by a second portion 21 of the surface 14. The active gates 26, 27 are disposed on the first portion 32 of the surface 14.

Figure 3:
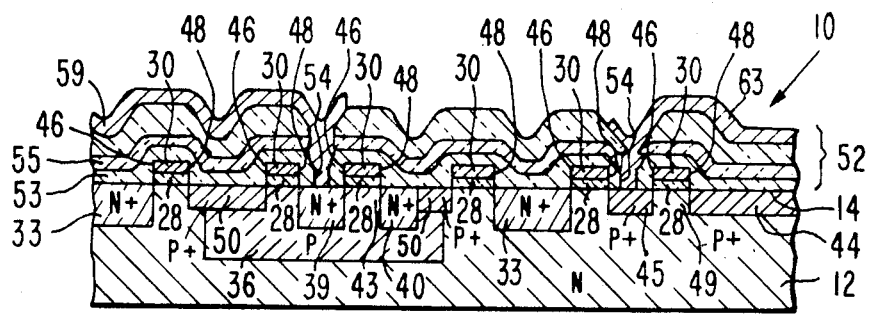
FIG. 3 is a cross-section taken along the line 3—3 of FIG. 1.
Figure 4:
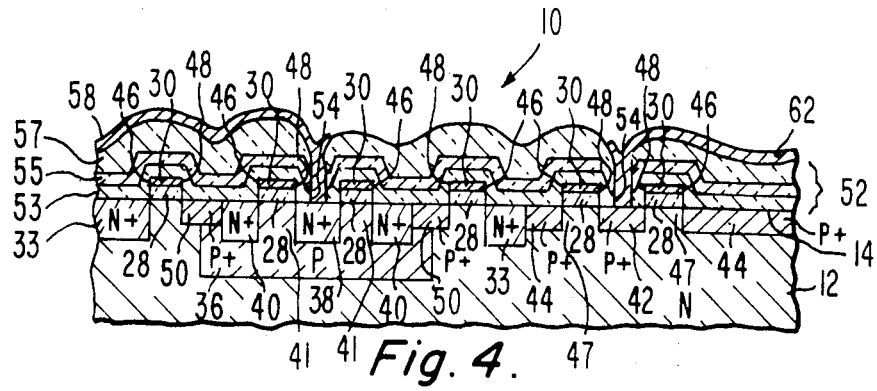
FIG. 4 is a cross-section taken along the line 4—4 of FIG. 1.

A well region 36 of conductivity type opposite that of the body 12, P-type in this example, is formed in the body 12 adjacent to the first portion 32 of the surface 14. Regions 38, 39 of N+ type conductivity are within the P-well region 36 adjacent to portions of the surface 14 which are surrounded by the active gates 26, 27 respectively. Another region 40 of N+ type conductivity is within the P-well region 36 adjacent to a portion of the surface 14 which surrounds the active gate 26 and a portion of the active gate 27. The regions 38 and 40 define the ends of a channel zone 41 of the IGFET 18 as shown in FIG. 4, and the regions 39 and 40 define the ends of a channel zone 43 for the IGFET 19 as shown in FIG. 3.

Regions 42, 45 of P+ type conductivity are in the body 12 adjacent to portions of the surface 14 which are surrounded by the active gates 24, 25 and another region 44 of P+ type conductivity is in the body 12 adjacent to a portion of the surface 14 which surrounds the active gates 24, 25. The regions 42 and 44 define the ends of a channel zone 47 for the IGFET 16 as shown in FIG. 4, and the regions 45 and 44 define the ends of a channel zone 49 for the IGFET 17 as shown in FIG. 3. Each of the gate structures 24, 25, 26 and 27 and the field shield 22 has an inner peripheral boundary and an outer peripheral boundary. For convenience the outer peripheral boundaries of the frame-like structures are each designated by the reference numeral 46 and the inner peripheral boundaries of the frame-like structures are each designated by the reference numeral 48. Each of the regions 32, 21, 38, 39, 42 and 45 has a surface in intercept boundary substantially contiguous to one or the other of an inner peripheral boundary 48 or an outer peripheral boundary 46.

Means including a first portion 42 of the surface 14 are provided for establishing ohmic contact to the well region 36. In the preferred embodiment of the invention, the means includes a well contact region 50 of P+ conductivity having a doping concentration higher than the doping concentration of the well region 36. The region 50 includes part of the first portion 32 of the surface 14 which lies between the field shield 22 and the active gates 26, 27. In this example, the region 50 surrounds the region 40 which in turn surrounds the active gate 26 but does not fully surround the active gate 27. An insulating coating 52 overlies substantially all of the surface of the device 10 and contains apertures 54 therethrough for permitting contact to be made to the various regions and conductive layers. The coating 52, which is the subject of the present invention comprises a three layer structure in the preferred embodiment of the invention. However, as will be more fully explained hereinafter, only two layers are necessary. In the preferred embodiment of the invention, the coating 52 comprises an insulating layer 53, preferably of undoped silicon dioxide which overlies the surface 14 and the frame-like structures 22, 24, 25, 26 and 27. Overlying the undoped silicon dioxide layer 53 is an impervious layer 55 which cannot be penetrated by steam or oxygen. In the preferred embodiment of the invention the impervious layer 55 is comprised of silicon nitride. Overlying the silicon nitride layer 55 is a protective overcoat layer of material which provides smooth contours for the metallization pattern which will be used to interconnect the various IGFETs on the integrated circuit 10. In the preferred embodiment of the invention, the protective overcoat layer is comprised of a PSG layer 57 having a phosphorus concentration of between 5% and 7% by weight as will be more fully explained hereinafter.

Figure 2:
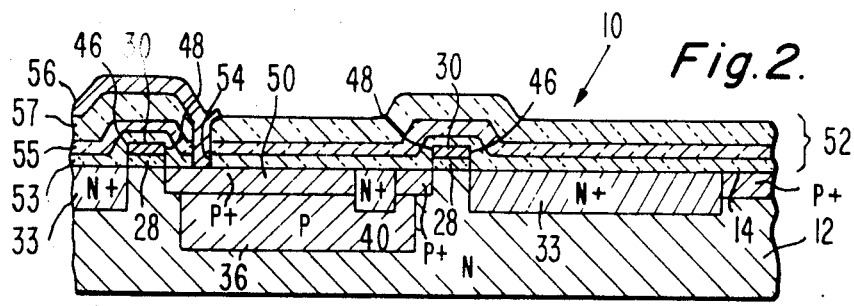
FIG. 2 is a cross-section taken along the line 2—2 of FIG. 1.
Figure 5:
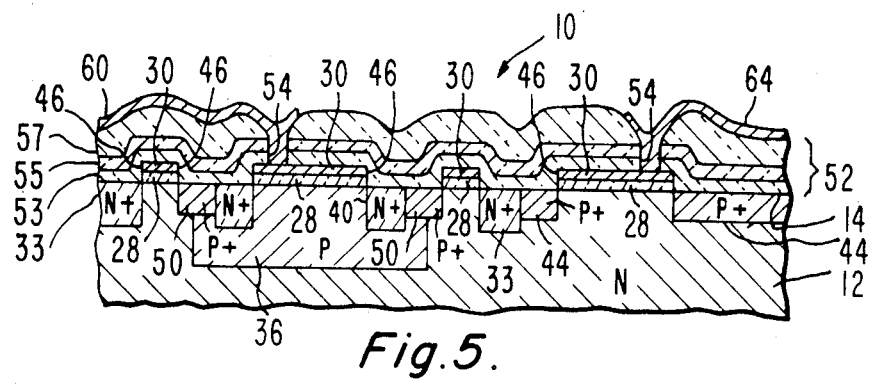
FIG. 5 is a cross-section taken along the line 5—5 of FIG. 1.
Figure 6:
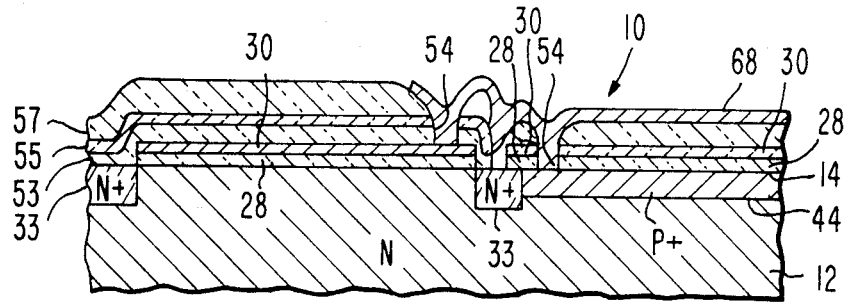
FIG. 6 is a cross-section taken along the line 6—6 of FIG. 1.

A source-substrate conductor 56 has a portion which extends through an opening 54 in contact with the P+ type region 50 as shown in FIGS. 1 and 2. Drain conductors 58, 59 have portions thereof extending through openings 54 into contact with the regions 38, 39 shown in FIGS. 4 and 3 respectively. A gate conductor 60 extends through an opening 54 into contact with the conductive layer 30 of the active gate 26 as shown in FIGS. 1 and 5, and a gate conductor 61 extends through an opening 54 and contacts the conductive layer 30 of the active gate 27. Similarly, drain conductors 62, 63 contact the regions 42, 45 of the IGFETs 16, 17 respectively as shown in FIGS. 1, 3 and 4 and gate conductors 64, 65 contact the conductive layers 30 of the active gates 24, 25, respectively, as shown in FIGS. 1 and 5. Finally, a source conductor 66 makes contact with the region 44.

The field shield 22 and the guardband 33 provide means for isolating the P-channel IGFETs 16, 17 from the N-channel IGFETs 18, 19. In the operation of the device 10, the guardband 33, the field shield 22, and the P+ source plane 44 are all connected together and to the power supply $V_{DD}$ by a power connector 68 shown in FIGS. 1 and 6, which electrically contacts the conductive layer 30 of the field shield 22, the N+ guardband 33 and the P+ source plane 44 through openings 54 in the insulating coating 52. While the guardband 33 alone could provide isolation between the P-channel IGFET 16, 17 and the N-channel IGFETs 18, 19 the field shield 22 insures that if there is any break in the guardband 33 created during manufacture, the field shield 22 will act as the gate of a P-channel IGFET whose drain is the P+ region 50 and whose source is the P+ source plane 44 which is permanently biased off by the presence of the $V_{DD}$ potential thereon through conductor 68.

The several conductors shown in FIGS. 1–6 do not interconnect IGFETs 16, 17, 18 and 19 together to perform any circuit function inasmuch as the circuit described therein is generally applicable to many different circuit configurations and is merely presented as the type of integrated circuit on which the present invention has been found to be highly beneficial.

FIGS. 7–12 illustrate the preferred embodiment of the method of manufacturing the present invention, particularly the application of the method to a bulk semiconductor body in the formation of $C^2L$ integrated circuits. For convenience, each cross-section of FIGS. 7–12 shows only the configuration in the plane of the cross-section.

In this example, the process begins with a semiconductor body 12 of (100) silicon of N-type conductivity which has a surface 14. The first step in the present process is to grow a thermal oxide layer 69 on the surface 14. Preferably, the layer 69 is formed by heating the body 12 to a temperature to about 1100° C. in an atmosphere of steam for a time sufficient to grow the oxide layer 69 to a thickness of approximately 6000Å.

Figure 7:
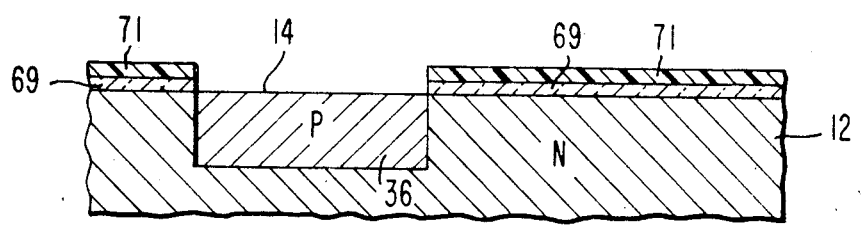
FIGS. 7-12 are a series of cross-sections illustrating the method of manufacturing the integrated circuit shown in FIG. 1.

Referring to FIG. 7, a layer of photoresist material 71 is applied over the oxide layer 69. The photoresist layer 71 is defined using a first photomask, and then the photoresist is developed to expose portions of the oxide layer 69. Next, the exposed portions of the oxide layer 69 are etched away to expose portions of surface 14. The body 12 is then placed in an ion implantation apparatus and an acceptor type impurity such as boron is implanted into the body 12. In the preferred embodiment of the invention, boron is implanted to a surface concentration of about $1.3 \times 10^{13}$ atoms/cm$^2$, then the photoresist layer 71 is removed. Thereafter, the implanted boron is diffused into the body 12 in a furnace heated to about 1200° C. for about 16 hours in order to form the P-well region 36 which has a final acceptor concentration of about $2 \times 10^{16}$ atoms boron/cm$^3$.

Next, the balance of the oxide layer 69 is stripped to expose the surface 14. A gate oxide layer 28 is then grown on the surface 14. Preferably, the gate oxide layer 28 is formed by heating the body 12 to a temperature of about 870° C. in an atmosphere of steam and a small quantity of HCl gas for a time sufficient to grow the oxide layer 28 to a thickness of approximately 1000Å.

Figure 8:
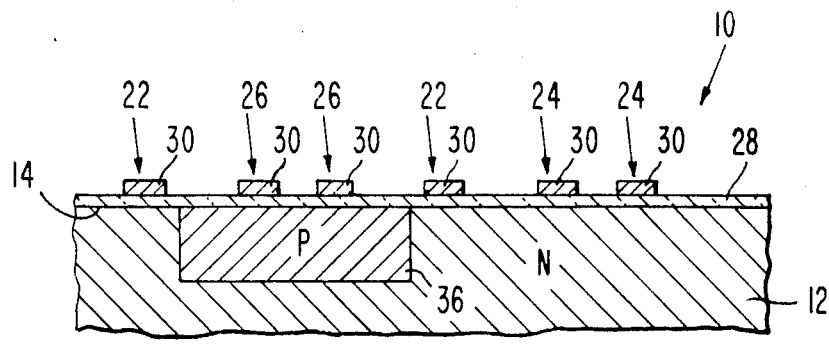

Following the growth of the oxide layer 28, the body 12 is placed in a deposition reactor and a layer 30 of conductive material, preferably polycrystalline silicon, is deposited thereon. Any known deposition reaction may be employed, such as the thermal decomposition of silane (SiH$_4$). The process is carried out for a time sufficient to form the layer 30 to a thickness of about 3500Å. Using conventional photolithographic techniques involving a second photomask, the layer 30 is next defined into the pattern of the field shield structure 22 and the active gate structures 24, 25, 26 and 27, which remain after etching. The etch of the undesired polycrystalline material may take place in a plasma reactor containing a small amount of carbon tetrafluoride gas and nitrogen. Following the etch the remaining photoresist material is stripped, as shown in FIG. 8.

Figure 9:
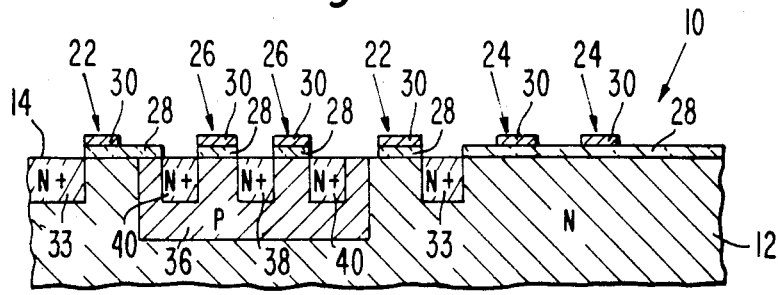

A new layer of photoresist is then applied on the surface of the wafer and a third photomask is used to define areas where N+ regions will be formed. The photoresist is defined, exposed, and developed and the exposed portions of the gate oxide layer 28 are removed by etching to expose the surface 14 of the body 12. Then, the balance of the photoresist is removed, exposing the remaining polycrystalline silicon gates. The body 12 is then placed in a diffusion furnace containing phosphorus oxychloride dopant for about 5–8 minutes at 1050° C. in order to form the N+ regions 33, 38 and 40, as shown in FIG. 9 and to dope the polycrystalline silicon material 30 to N+ conductivity, making it conductive.

The portions of the oxide layer 28 which are not covered by polycrystalline silicon 30 are then removed by etching using the polycrystalline silicon areas 30 as an etch mask. Next, the body 12 is placed in a furnace to grow a thermal oxide on the exposed surface. Oxides over N+ doped silicon grow faster than oxides over lightly doped silicon. Accordingly, in the time taken to grow a thermal oxide having a thickness of about 900Å over the lightly doped areas, an oxide having a thickness of about 2500Å is grown over the N+ doped areas.

Figure 10:
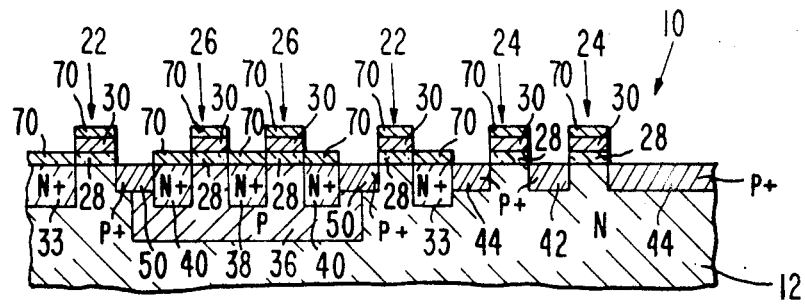

Referring to FIG. 10, the oxide is then etched to remove the thinner portions and to leave a residual oxide 70 over the N+ doped areas and the polycrystalline silicon regions 30 as shown. The body 12 is then placed in a diffusion furnace heated to about 1000° C. and subjected to a boron nitride diffusion for approximately 20 minutes to form P+ regions 42, 44 and 50. The P+ diffusion is of a lower concentration than was the N+ diffusion and consequently the N+ doped polycrystalline silicon regions 30 remain N+ doped.

Following the P+ diffusion, the remaining portions of the residual oxide 70, over the N+ regions and on the polycrystalline silicon layers 30, are removed by etching. The body 12 is then placed in a furnace heated to about 870° C. in the presence of steam and HCl for about 15 minutes to reoxidize the polycrystalline silicon gates.

Next, the insulating coating 52, which includes the present invention, is formed. In forming the insulating coating 52, first an undoped silicon dioxide layer 53 is applied over the surface 14. In the preferred embodiment of the invention, the undoped silicon dioxide layer is deposited by a chemical vapor deposition (CVD) to a thickness of about 1500Å. Next, the CVD film is densified by heating it in a nitrogen (N$_2$) atmosphere at about 1000° C. for about 10 minutes. Using a layer of photoresist and a fourth photomask the contact openings 54 are defined and opened through the undoped silicon dioxide layer 53.

Next, a layer of silicon nitride ($Si_3N_4$) 55 is deposited by the reaction of silane and ammonia at about 800° C. to a thickness of about 900Å. The silicon nitride layer 55 is necessary to present an impervious barrier to prevent oxidation of the surface 14 which was exposed during the preceding etch step.

Figure 11:
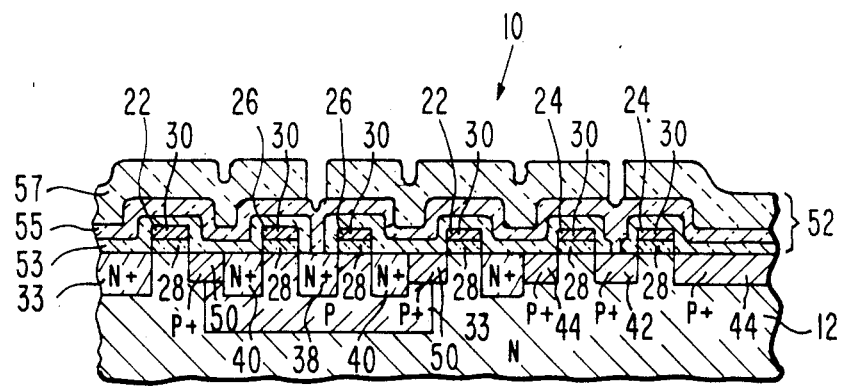

Following the deposition of the silicon nitride layer 55, a PSG layer 57 having a phosphorus concentration between about 5 and 7% by weight is next deposited on the surface of the silicon nitride layer 55 at a temperature of about 400° C. The PSG layer is preferably deposited by the reaction between silane and phosphine. Following the deposition of the PSG layer 57, contact openings 54 are formed therein coincident with the contact openings 54 previously formed in the undoped silicon dioxide layer 53. The contact openings 54 in the PSG layer 57 are preferably etched using buffered hydrofluoric acid, which etch will essentially stop when the silicon nitride layer 55 is reached. Following the etch of the PSG layer 57, the structure will be as shown in FIG. 11 and will include sharp edges where the contact openings 54 have been formed through the PSG layer 57 and will have a topology where polycrystalline silicon lines are crossed which is very difficult to coat with metal. In order to remove the sharp edges from the PSG layer 57 and to improve the topology over the polycrystalline silicon lines, the PSG layer 57 is heated to about 1050° C. for about 15 minutes in an atmosphere containing steam. During this critical step in the processing the PSG "flows" resulting in smoothly contoured edges to which metal may be applied. It is only possible to use less than 7% phosphorus in the PSG layer 57 and still achieve adequate "flow" for relatively short time exposures at 1050° C. because of the presence of the steam in the atmosphere. It is only possible to use steam in that atmosphere because of the presence of the impervious $Si_3N_4$ layer 55 which prevents the thermal oxidation of contact areas lying beneath the openings 54 in the PSG layer 57. Thus, the present invention provides a process by which a steam atmosphere may be used to flow a PSG layer which contains an adequate amount of phosphorus for flow and getter purposes but which does not contain so much phosphorus that long term reliability problems, such as "black metal" problems will be created. An additional advantage of the steam flow of the PSG layer 57 is that impurities on the upper surface of the layer 57 are leached out of the layer 57 during the steam aided flow.

Following the steam aided flow step, the furnace is flushed with nitrogen for about 5 minutes after which the body 12 is pulled into a so-called "white elephant", a tube at the end of the furnace, in which the body 12 is cooled in a nitrogen atmosphere.

Following the removal of the body 12 from the furnace, the portions of the silicon nitride layer 55 lying between the openings 54 in the undoped silicon dioxide layer 53 and the PSG layer 57 are removed by placing the body 12 into an etch solution comprising a mixture of phosphoric acid ($H_3PO_4$) into which there is mixed 10% or less sulfuric acid ($H_2SO_4$), which mixture is heated to about 180° C. for a time sufficient to extend the contact openings 54 through to the surface 14.

Next, an anneal is performed in forming gas, a mixture of hydrogen and nitrogen, at about 740° C. for 16 hours. Following the forming gas anneal, the body 12 may be dipped into a buffered hydrofluoric acid to remove any oxide which may have formed on the surface 14.

Figure 12:
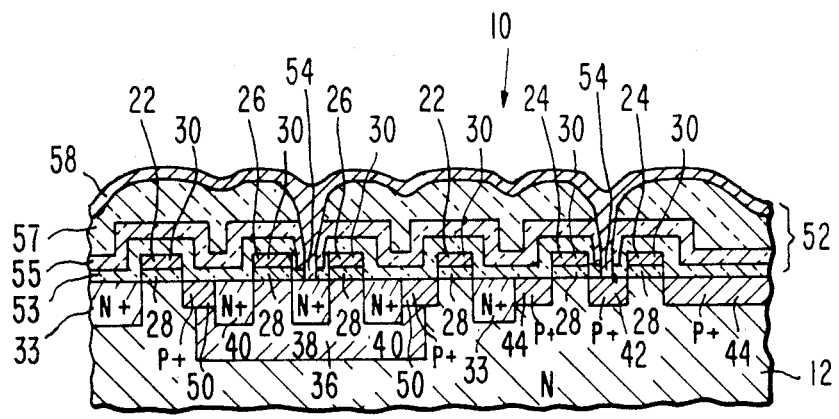

Next, a layer of metal 59 such as aluminum, is evaporated over the surface of the insulating coating 52 to obtain the structure shown in FIG. 12. Using a photolithographic process, the metal layer 59 is defined to form interconnects which connect the various IGFETs on the integrated circuit 10. Then, a metal protect passivating oxide having a thickness of about 10,000Å is formed over the surface of the entire body 12, and bond pad openings are formed in the passivating oxide by a photolithographic process. The formation of the passivating oxide and of the bond pad openings are well known in the art and are not shown in the figures.

While the preferred embodiment of the invention has been described with reference to $C^2L$ processing, it should be recognized that alterations to the preferred embodiment may be accomplished without departing from the spirit or scope of the invention. In particular, if additional contouring of the PSG layer 57 is desired in order to provide a smoother contour through the contact openings 54 in the silicon nitride layer 55, the only alteration required in the process specified would be that the contact openings 54 through the undoped silicon dioxide layer 53 would not be formed until after the contact openings 54 were extended through the silicon nitride layer 55. At that point, a reflow, i.e. a second flow of the PSG could be performed without exposing any P+ areas to the phosphorus from the PSG layer 57, because the undoped silicon dioxide layer 53 would act as a shield for the P+ regions. Following the reflow, the contact openings 54 could be extended through the undoped silicon dioxide layer 53 without additional photolithographic steps by placing the body into a buffered hydrofluoric acid solution and using the silicon nitride layer 55 as an etch mask.

In view of the fact that the preferred embodiment of the present invention does not require the "reflow" step, the undoped silicon dioxide layer 53 is not absolutely required. However, by providing the layer 53, various advantages are gained. For example, the layer 53 may be predefined in the manner discussed above to give greater control over the location of the contact openings 54 than would be provided by etching through the thick PSG layer 57. In addition, the presence of the layer 53 provides a diffusion barrier if a "reflow" of the PSG layer is desired following the openings of the contact holes 54 through the silicon nitride layer 55. In the event that such a "reflow" step is desired, the predefinition of the contact openings 54 through the undoped layer 53 prior to the deposition of the silicon nitride layer 55 would not be accomplished.

It is also possible to accomplish a reflow step without the use of the undoped silicon dioxide layer 53, by following the steps enumerated above and heating the body 12 to a temperature sufficient to grow oxide on any exposed portions of the surface 14 but not sufficient to cause a reflow of the PSG layer 57. Again, that could be accomplished without the use of the undoped silicon dioxide layer 53.

While the reflow step is not utilized in the preferred embodiment of the invention, there may well be other processes which would be employed in the manufacturing of NMOS, PMOS or bipolar integrated circuits in which the reflow, which the present invention is capable of providing would be desirable. It should be recognized by those skilled in the art that the shield which the silicon dioxide layer 53 is capable of providing or which could alternatively be provided by the thermal oxidation portions of the surface 14 exposed through openings formed in the silicon nitride layer 55 in the manner specified above, i.e. at a temperature inadequate to cause the PSG to reflow, is only required to protect exposed regions having a P type conductivity from being counterdoped by phosphorus from the PSG layer 57. Thus, if the present invention is being used exclusively for the purpose of making NMOS devices there would be no exposed P type regions so that the possibility of counterdoping would not exist.

In addition to the embodiments described above, and the reasons discussed heretofore for utilizing the present invention, those skilled in the art will recognize that the present invention may be used to solve other problems in the manufacture of semiconductor devices. For example, the invention may be used to contour otherwise abrupt topologies of the type which may occur in bipolar integrated circuits employing dielectric isolation. In such structures, a trench is formed in the dielectric isolation during the processing step in which the oxide overlying the finished device is stripped. While certain metals, such as gold or silver, may be electroplated consistently over such trenches, applications exist where it is beneficial to evaporate aluminum over such structures. The present invention can be used to provide contoured surfaces to which evaporated aluminum provides a more consistent covering than was heretofore possible.

The invention may also be used to contour the step which occurs in aluminum gate MOS processing. A step is formed between the thick field oxide in the field regions and the active device areas which are substantially thinner.

The invention should also be beneficial in the manufacture of high frequency transistors of the type which employ narrow metallization lines leading to small bond pads which are disposed from the surface of the semiconductor material by a thick oxide. Heretofore, a problem with such structures has involved running metallization from the high bond pads down to the narrow metallization lines along the steep walls of the oxide on which the bond pads are located. By using the present invention, a contoured region can be provided over which the metallization can be applied and delineated.

While the present invention has been discussed with regard to the advantages which it provides in allowing a PSG layer with reduced phosphorus content to be flowed, it would be obvious to those skilled in the art that while the presence of steam acts to reduce the phosphorus content required to flow a PSG layer at a given temperature, it also acts to lower the temperature at which PSG with a given phosphorus content will flow. Accordingly, the present invention is also useful in the manufacture of radiation hardened integrated circuits in which the temperature at which the integrated circuits are manufactured is kept as low as possible. Accordingly, radiation hardened integrated circuits can have a flowed PSG layer which is flowed at a temperature less than 1000° C. by providing the PSG layer with a sufficient amount of phosphorus to enable it to flow at a lower temperature in the presence of steam. For example, a PSG layer containing 10% phosphorus by weight can be flowed at about 950° C. While the 10% phosphorus content is higher than the content heretofore discussed, the invention provides a flowed PSG layer at the low temperature required for the processing of radiation hardened integrated circuits. Also, PSG layers can be provided on bipolar integrated circuits where they can be flowed at relatively low temperatures to avoid undesired lateral diffusions.

The invention is also beneficial in the manufacture of other integrated circuits which require smooth contours. An example of such integrated circuits would be those which utilize both polycrystalline gates and/or interconnects over which gold metallization is electroplated. Without the contoured surfaces provided by the invention, gold has a tendency to adhere to the steep walls of the dielectric which covers the polycrystalline silicon in places where no metallization is desired. In addition, the presence of the impervious silicon nitride layer allows metallization techniques which have a relatively high degree of contamination, either in the metal or the technique of deposition, to be used in the manufacture of integrated circuits. Examples are "hot-metal" deposition, i.e. the evaporation of aluminum in which the substrate is heated or "solution plating" processes.

What is claimed is:

1. An improved passivating composite for an integrated circuit device of the type comprising a body of semiconductor material having semiconductor devices formed therein, the improvement comprising:
    (a) an oxide layer formed over the surface of said body of semiconductor material;
    (b) a steam-impervious layer comprising silicon nitride formed over said oxide layer;
    (c) a phosphosilicate glass layer formed directly over said steam-impervious layer;
    (d) contact openings which extend through said phosphosilicate glass layer, through said steam-impervious layer, and through said oxide layer to the underlying semiconductor region, the phosphosilicate glass layer extending through the contact openings through the steam-impervious layer, the upper edges of said contact openings in said phosphosilicate glass layer being rounded; and
    (e) a metallic layer overlying said phosphosilicate glass layer, said metallic layer extending over said rounded edges and through said contact openings, to electrically contact all semiconductor regions which underlie any portion of said contact openings and to contact a portion of said oxide layer.

2. The device of claim 1 wherein said phosphosilicate glass layer contains less than 7% phosphorus by weight.

* * * * *